United States Patent [19]

Mori et al.

[11] Patent Number: 4,873,440
[45] Date of Patent: Oct. 10, 1989

[54] ELECTRON MICROSCOPE IMAGE OUTPUT METHOD AND APPARATUS

[75] Inventors: Nobufumi Mori; Takayuki Katoh, both of Kanagawa; Tetsuo Oikawa; Yoshiyasu Harada, both of Tokyo; Junji Miyahara, Kanagawa, all of Japan

[73] Assignees: Fuji Photo Film Co., Ltd., Kanagawa; Jeol Ltd., Tokyo, both of Japan

[21] Appl. No.: 137,691

[22] Filed: Dec. 24, 1987

[30] Foreign Application Priority Data

Dec. 26, 1986 [JP] Japan .................. 61-311125

[51] Int. Cl.$^4$ .................. G03B 42/00
[52] U.S. Cl. .................. 250/327.2; 250/397; 382/6
[58] Field of Search .......... 250/327.2 C, 311, 484.1 B, 250/484.1 A, 397; 382/23, 6; 355/80

[56] References Cited

U.S. PATENT DOCUMENTS

| 4,258,264 | 3/1981 | Kotera et al. | 250/484.1 |
|---|---|---|---|
| 4,263,001 | 4/1981 | Deutsch | 355/45 |
| 4,276,473 | 6/1981 | Kato et al. | 250/372.2 |
| 4,315,318 | 2/1982 | Kato et al. | 364/515 |
| 4,316,087 | 2/1982 | Yanaka et al. | 250/307 |
| 4,387,428 | 6/1983 | Ishida et al. | 364/414 |
| 4,387,428 | 6/0083 | Ishida et al. | 364/414 |
| 4,400,619 | 8/1983 | Kotera et al. | 250/327.2 |
| 4,651,220 | 3/1987 | Hosoi et al. | 358/256 |

FOREIGN PATENT DOCUMENTS

| 18361 | 2/1978 | Japan | 382/6 |
|---|---|---|---|
| 55-47719 | 12/1980 | Japan | . |
| 55-47720 | 12/1980 | Japan | . |
| 56-11395 | 2/1981 | Japan | 250/327.2 |

Primary Examiner—Constantine Hannaher
Attorney, Agent, or Firm—Sughrue, Mion, Zinn, Macpeak & Seas

[57] ABSTRACT

In a system for outputting an electron microscope image, a two-dimensional sensor for storing electron beam energy thereon is exposed to an electron beam passing through a specimen in a vacuum to have the electron beam energy stored on the two-dimensional sensor, and is then exposed to light or heat to release the stored energy as light emission. The emitted light is photoelectrically detected to obtain image signals, and an electron beam image of the specimen is output on the basis of the image signals. The specimen is divided into a plurality of divisions, and the storage of the electron beam energy is carried out for each of the divisions. The image signals obtained at the divisions are combined to form composite image signals that represent an overall specimen image formed by a group of the divisions, and the image signals at the divisions are corrected so that signal values of the boundary areas of adjacent divisions become approximately equal to each other.

2 Claims, 2 Drawing Sheets

4,873,440

ELECTRON MICROSCOPE IMAGE OUTPUT METHOD AND APPARATUS

BACKGROUND OF THE INVENTION

1. Field of the Invention

This invention relates to a method of outputting an electron microscope image, and to an apparatus for carrying out the method. This invention particularly relates to a method of outputting an electron microscope image so that no difference in density arises at boundaries between partial images in the case where a plurality of partial images of a specimen are combined to output an overall electron microscope image of the specimen, and to an apparatus for carrying out the method.

2. Description of the Prior Art

There have heretofore been known electron microscopes for obtaining an enlarged image of a specimen by use of an electric field or a magnetic field to refract an electron beam passing through the specimen. In an electron microscope, a diffraction pattern of the specimen is formed on a back focal plane of an objective lens by the electron beam passing through the specimen, and the enlarged image of the specimen is formed by interference of the diffracted waves. The enlarged image (transmitted image) of the specimen is observed when the enlarged image is projected by a projection lens. Also, when the diffraction pattern on the back focal plane is projected, an enlarged diffraction pattern of the specimen is observed. In the case where an intermediate lens is disposed between the objective lens and the projection lens, the aforesaid enlarged image (transmitted image) or the diffraction pattern may be obtained as desired by adjusting the focal length of the intermediate lens.

In general, in order to view the enlarged image or the diffraction pattern formed in the manner as mentioned above (both the enlarged image and the diffraction pattern are hereinafter generically referred to as the electron beam image), heretofore a photographic film has been disposed at the plane of image formation of the projection lens to expose the photographic film to the electron beam image, or an image intensifier has been used for intensification and projection of the electron beam image. However, the method wherein photographic film is used has the drawback that the sensitivity of the photographic film with respect to the electron beam is low and troublesome development processing is necessary. On the other hand, the method wherein an image intensifier is used is disadvantageous in that image sharpness is low and the image is readily distorted.

Also, the electron beam image mentioned above is often subjected to image processing such as gradation processing, frequency response enhancement processing, density processing, subtraction processing or addition processing, reconstruction of a three-dimensional image by Fourier analysis, image analysis for conversion of an image into two-value system or for grain size measurement, or diffraction pattern processing for analysis of crystal information or for measurement of the grating constant, transition and grating defects. In such a case, a microscope image obtained by development of a photographic film has heretofore been detected by use of a microphotometer and converted into electric signals, which are then subjected to A/D conversion or the like and processed by computer. Such operations are very troublesome.

In view of the above circumstances, the applicant proposed in Japanese Unexamined Patent Publication Nos. 61(1986)-51738 and 61(1986)-93539 a novel method of recording and reproducing an electron microscope image wherein the electron microscope image is recorded and reproduced with a high sensitivity and with a high image quality, and wherein electrical signals carrying the electron microscope image are obtained directly so that various kinds of processing are facilitated. Basically, the proposed method of recording and reproducing an electron microscope image comprises the steps of (i) exposing a two-dimensional sensor such as a stimulable phosphor sheet for electron beam energy storage to an electron beam passing through a specimen in a vacuum to have the electron beam energy stored on the two-dimensional sensor, then (ii) exposing the two-dimensional sensor to light or heating it to release the stored energy as light emission, (iii) photoelectrically detecting the emitted light to obtain image signals, and (iv) reproducing the electron beam image of the specimen by use of the image signals.

The aforesaid two-dimensional sensor is formed of a material that is capable, upon exposure to an electron beam, of temporarily storing at least a part of electron beam energy, and which can then, upon excitation from the exterior release at least a part of the stored energy in a detectable form such as light, electricity or sound. A stimulable phosphor sheet as disclosed in, for example, U.S. Pat. Nos. 4,258,264, 4,276,473, 4,315,318 and 4,387,428 and Japanese Unexamined Patent Publication No. 56(1981)-11395 is particularly suitable for use as the two-dimensional sensor. Specifically, when certain kinds of phosphors are exposed to a radiation such as an electron beam, they store a part of the energy of the radiation. When the phosphor which has been exposed to the radiation is then exposed to stimulating rays such as visible light, the phosphor emits light in proportion to the stored energy of the radiation. A phosphor exhibiting such properties is referred to as a stimulable phosphor. By "stimulable phosphor sheet" is meant a sheet-shaped recording material comprising the aforesaid stimulable phosphor. In general, a stimulable phosphor sheet is composed of a supporting material and a stimulable phosphor layer overlaid on the supporting material. The stimulable phosphor layer is comprised of an appropriate binder and the stimulable phosphor dispersed therein. A stimulable phosphor layer that is self-supporting can by itself form the stimulable phosphor sheet. Examples of a stimulable phosphor for constituting the stimulable phosphor sheet are described in detail in Japanese Unexamined Patent Publication No. 61(1986)-93539.

It is also possible to use a thermal phosphor sheet as disclosed in, for example, Japanese Patent Publication Nos. 55(1980)-47719 and 55(1980)-47720 as the two-dimensional sensor. The thermal phosphor sheet is a sheet-shaped recording material comprising a phosphor (thermal phosphor) which releases the stored radiation energy as thermal fluorescence mainly by the heat effect.

With the aforesaid method of recording and reproducing an electron microscope image wherein an electron microscope image is stored on a two-dimensional sensor such as a stimulable phosphor sheet, the electron microscope image can be recorded at high sensitivity. Therefore, the intensity of the electron beam used for the recording of the electron microscope image can be decreased, minimizing damage to the specimen. With this method of recording and reproducing an electron microscope image, it also becomes very easy to carry out image processing of the electron microscope image such as gradation processing and frequency response enhancement processing. By feeding the electrical signals to a computer, it also becomes possible to carry out diffraction pattern processing, reconstruction of a three-dimensional image, and an image analysis for image conversion into a two-value system or the like simply and quickly.

On the other hand, an overall electron microscope image of a specimen is often output by combining a plurality of partial images of the specimen. Such a method of outputting an electron microscope image is widely used when, for example, the image of the specimen is to be viewed at a high resolution and over a wide range.

The output of a composite image has heretofore been carried out by a method wherein, first, hard copies of electron microscope images of respective portions (divisions) of a specimen are produced, and the composite image is formed by joining the hard copies together. However, when the composite image is thus output, differences in density arise at boundaries between adjacent partial images, making the composite image unsuitable for viewing purposes.

Such a problem is caused mainly by slight variations in the amounts of exposure to the electron beam among the recording steps for the respective partial images. When a two-dimensional sensor as mentioned above is used, the aforesaid problems are also produced by variations in the amount of exposure to light or to the amount of heat for image read-out among the respective partial images. When different two-dimensional sensors are used for the respective partial images, variations in sensitivity among the two-dimensional sensors also may constitute a cause of the aforesaid problems.

SUMMARY OF THE INVENTION

The primary object of the present invention is to provide a method of outputting an electron microscope image whereby an overall electron microscope image of a specimen is output by combining partial images of the specimen so that no difference in density arises at boundaries between adjacent partial images.

Another object of the present invention is to provide a method of outputting an electron microscope image whereby a composite electron microscope image of high image quality suitable for viewing purposes is obtained.

Another object of the present invention is to provide an apparatus for carrying out the method.

The present invention provides a method of outputting an electron microscope image by exposing a two-dimensional sensor for electron beam energy storage to an electron beam passing through a specimen in a vacuum to have the electron beam energy stored on the two-dimensional sensor, then exposing the two-dimensional sensor to light or heat to release the stored energy as light emission, photoelectrically detecting the emitted light to obtain image signals, and outputting an electron beam image of the specimen on the basis of the image signals, wherein an improvement comprises the steps of:

(i) dividing said specimen into a plurality of divisions and carrying out said storage of the electron beam energy for each of said divisions, (ii) combining said image signals obtained at said divisions so that the composite image signals represent an overall specimen image formed by a group of said divisions, and (iii) correcting said image signals so that signal values of the boundary areas of adjacent divisions become approximately equal to each other.

The present invention also provides an apparatus for outputting an electron microscope image, which comprises:

(i) a two-dimensional sensor for storing an electron beam image of a specimen formed by a distribution of electron beam energy, said two-dimensional sensor being disposed in the same vacuum system as an image formation plane of the electron microscope, (ii) a stimulation means for exposing said two-dimensional sensor to light or heat, (iii) a detection means for photoelectrically detecting light emitted by said two-dimensional sensor upon exposure to light or heat, thereby to obtain image signals, and (iv) a signal correction means for correcting the image signals detected at a plurality of divisions into which said specimen has been divided and storage of the electron beam image carried out for each of said divisions, so that signal values of the boundary areas of adjacent divisions become approximately equal to each other.

The present invention was made on the basis of findings that image signals representing an electron microscope image are formed easily with the aforesaid method of recording and reproducing an electron microscope image in which a two-dimensional sensor is used.

With the method of and apparatus for outputting an electron microscope image in accordance with the present invention wherein the image signals at the respective divisions are corrected so that signal values of adjacent divisions at the boundary therebetween become approximately equal to each other, the density levels of the adjacent divisions at the boundary therebetween become approximately equal to each other, and no difference in density arises at boundaries among the combined partial images of a composite image output based on the image signals. Accordingly, a composite electron microscope image having a high image quality suitable for viewing purposes can be obtained.

DESCRIPTION OF THE PREFERRED EMBODIMENTS

The present invention will hereinbelow be described in detail with reference to the accompanying drawings.

Figure 1:
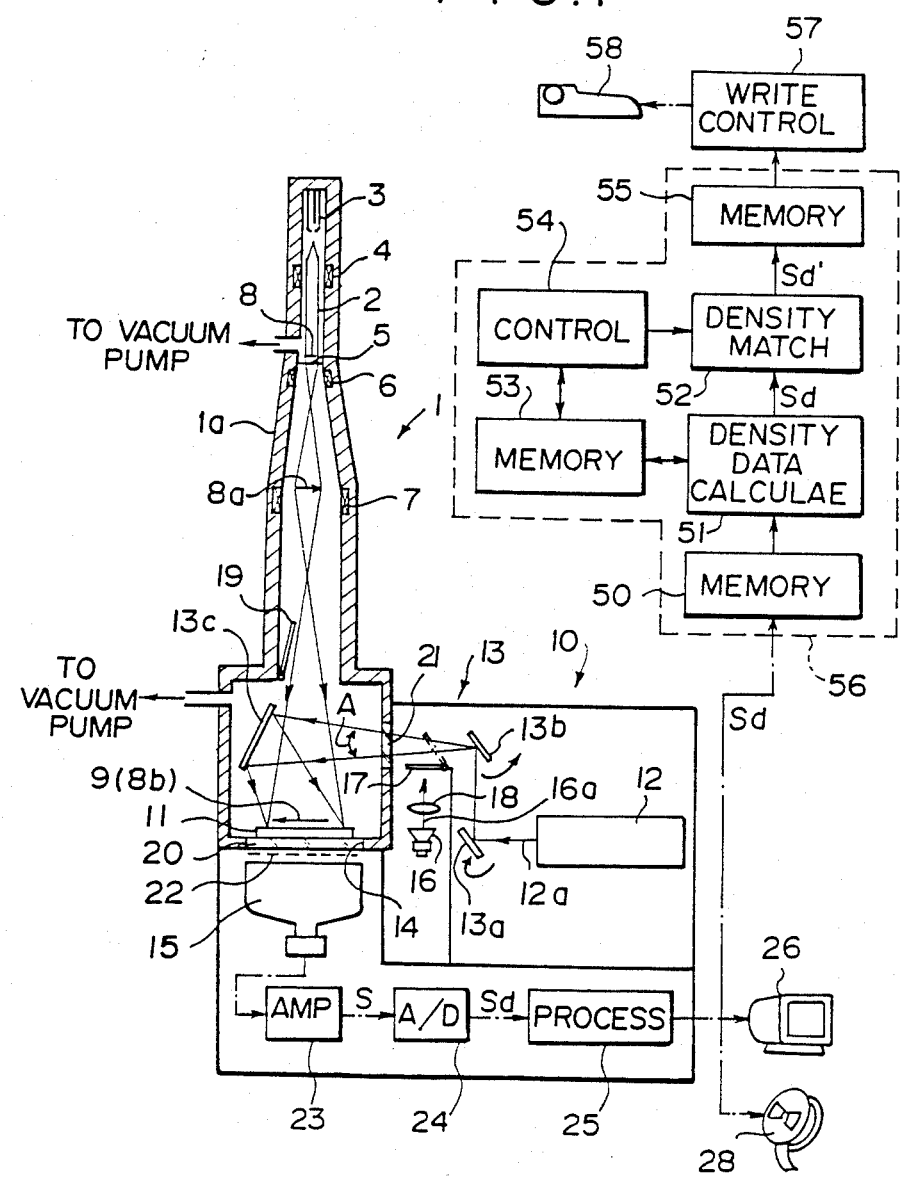
FIG. 1 is a schematic view of an apparatus for outputting an electron microscope image by an embodiment of the method in accordance with the present invention.

With reference to FIG. 1, a microscope column 1a of an electron microscope 1 is provided with an electron gun 3 for emitting an electron beam 2 at a uniform intensity, at least one condenser lens 4 for converging the electron beam 2 onto a specimen plane, a specimen holder 5, an objective lens 6 of the same type as the condenser lens 4, and a projection lens 7. The electron beam 2 passing through a specimen 8 disposed on the specimen holder 5 is refracted by the objective lens 6 to form an enlarged transmitted image 8a of the specimen 8. The enlarged transmitted image 8a is projected by the projection lens 7 onto a plane of image formation 9 to form an image 8b.

An electron microscope image recording and read-out apparatus 10 is disposed under the microscope column 1a. The electron microscope image recording and read-out apparatus 10 is provided with a two-dimensional sensor (hereinafter referred to as a stimulable phosphor sheet) 11 composed of a stimulable phosphor that is secured on the plane of image formation 9 in the microscope column 1a, a stimulation means composed of a stimulating ray source 12 and an optical scanning system 13, a photomultiplier 15 facing the stimulable phosphor sheet 11 via a light-permeable window 14 formed in a peripheral wall of the microscope column 1a, and an erasing light source 16.

The stimulable phosphor sheet 11 comprises a transparent supporting material and a stimulable phosphor overlaid on the transparent supporting material. By way of example, the stimulating ray source 12 is constituted by a He—Ne laser or a semiconductor laser, and the optical scanning system 13 comprises a first light deflector 13a, a second light deflector 13b, and a fixed mirror 13c. As the first light deflector 13a and the second light deflector 13b, a known light deflector such as a galvanometer mirror, a polygon mirror, a hologram scanner or an acousto-optic deflector (AOD) may be used. A stimulating ray beam 12a emitted by the stimulating ray source 12 is deflected by the first light deflector 13a and is then deflected by the second light deflector 13b in a direction indicated by arrow A that is normal to the direction of the first optical deflection. The stimulating ray beam 12a is then passed through a light-permeable window 21 formed of lead glass or the like into the microscope column 1a, and is reflected by the fixed mirror 13c toward the stimulable phosphor sheet 11. In this manner, the stimulable phosphor sheet 11 is scanned by the stimulating ray beam 12a in the X and Y directions. Though not shown, the stimulating ray beam 12a emitted by the stimulating ray source 12 should preferably be passed through a filter to cut off light having a wavelength within the wavelength range of light that is emitted by the stimulable phosphor sheet 11, as will be described later, and then passed through a beam expander for adjusting the beam diameter of the stimulating ray beam 12a. The stimulating ray beam 12a should then be deflected by the first light deflector 13a and the second light deflector 13b, passed through an fθ lens, and made to impinge upon the stimulable phosphor sheet 11 as a beam having a uniform diameter.

The erasing light source 16 generates light having a wavelength within the stimulation wavelength range of the stimulable phosphor sheet 11. A mirror 17 that is moveable between a position in the optical path of the stimulating ray beam 12a and a position away from the optical path is disposed between the second light deflector 13b and the fixed mirror 13c. Erasing light 16a emitted by the erasing light source 16 is condensed by a lens 18. When the mirror 17 is positioned in the optical path of the stimulating ray beam 12a, the erasing light 16a is reflected by the mirror 17 and the fixed mirror 13c, and is projected onto the overall surface of the stimulable phosphor sheet 11. A shutter 19 for intercepting the electron beam 2 is disposed in the microscope column 1a between the objective lens 6 and the stimulable phosphor sheet 11, and an optical shutter 22 is disposed between the stimulable phosphor sheet 11 and the photomultiplier 15. A glass plate 20 provided with an optical filter for transmitting only light emitted by the stimulable phosphor sheet 11 and intercepting the stimulating ray beam 12a is fitted to the light-permeable window 14. As in an ordinary electron microscope, during operation of the electron microscope the inside of the microscope column 1a, including the section where the stimulable phosphor sheet 11 is disposed, is maintained in a vacuum by a known means such as a vacuum pump.

The output of the photomultiplier 15 is fed to an amplifier 23, an A/D converter 24 and a signal processing circuit 25, and is ultimately sent to an image reproducing apparatus 26 constituted by a cathode ray tube (CRT) or the like. Digital image signals Sd generated by the signal processing circuit 25 may be fed also to an image memory 50 as will be described later.

Recording and read-out of the electron microscope image by use of the electron microscope image recording and read-out apparatus 10 having the configuration mentioned above will hereinbelow be described in detail. After the specimen 8 is placed on the specimen holder 5, the electron gun 3, the condenser lens 4, the objective lens 6 and the projection lens 7 are operated, and the shutter 19 is opened as shown in FIG. 1. As a result, energy of the electron beam 2 carrying an enlarged image of the specimen 8 is stored on the stimulable phosphor sheet 11 secured on the plane of image formation 9. In the course of exposure to the electron beam 2, the optical shutter 22 should preferably be closed. The shutter 19 is then closed, the optical shutter 22 is opened, and the stimulating ray beam 12a emitted by the stimulating ray source 12 and deflected in the X and Y directions is made to impinge upon the stimulable phosphor sheet 11. The stimulable phosphor sheet 11 is two-dimensionally scanned by the stimulating ray beam 12a deflected thus, and is caused to release light of an intensity that is proportional to the level of the stored electron beam energy. The light emitted by the stimulable phosphor sheet 11 is received by the photomultiplier 15 via the glass plate 20 provided with the optical filter for intercepting the stimulating ray beam 12a, and the amount of the emitted light is detected photoelectrically by the photomultiplier 15.

The output of the photomultiplier 15 representing the amount of the light emitted by the stimulable phosphor sheet 11 in proportion to the stored electron beam energy is amplified by the amplifier 23 to electric signals (read-out image signals) S of appropriate levels. The read-out image signals S are then converted by the A/D converter 24 to digital image signals Sd, which are subjected to image processing such as gradation processing or frequency response enhancement processing in the signal processing circuit 25 and sent to the image reproducing apparatus 26. The image reproducing apparatus 26 outputs an image on the basis of the read-out image signals S, and the enlarged image 8b which the light emitted by the stimulable phosphor sheet 11 represents is reproduced in this manner.

Figure 2:
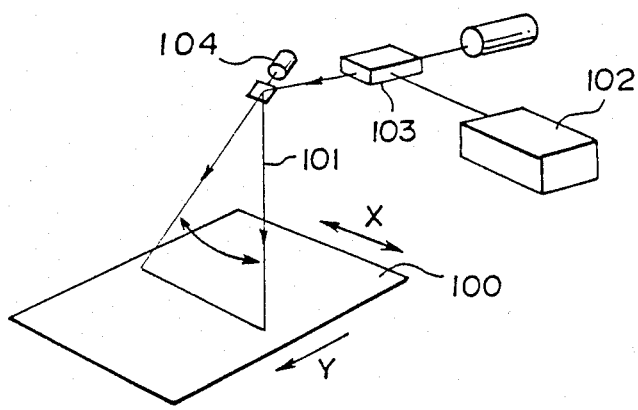
FIG. 2 is a schematic perspective view of an example of the apparatus for reproducing the electron microscope image.

Instead of a CRT, an optical scanning recording apparatus as shown in FIG. 2 may be used as the image reproducing apparatus 26. The case wherein the image is reproduced by use of the optical scanning recording apparatus shown in FIG. 2 will now be described briefly. A photosensitive film 100 is moved in the sub-scanning direction as indicated by the arrow Y in FIG. 2, and at the processing such as gradation processing or frequency response enhancement processing in the signal processing circuit 25 and sent to the image reproducing apparatus 26. The image reproducing apparatus 26 outputs an image on the basis of the A/O modulator 103 on the basis of the image signals fed from a signal feeding circuit 102 to thereby form a visible image on the photosensitive film 100. When the image signals Sd generated by the signal processing circuit 25 are used as the modulation image signals, the enlarged image 8b corresponding to the image stored on the stimulable phosphor sheet 11 is reproduced on the photosensitive film 100.

The image signals Sd generated by the signal processing circuit 25 may be immediately sent to the image reproducing apparatus 26 and used for reproduction of the electron microscope image as mentioned above, or may be stored on a storage medium 28 constituted by a magnetic tape, a magnetic disk or the like.

After the detection of the light emitted by the stimulable phosphor sheet 11, i.e. the read-out of the electron microscope image, is finished in the above-described manner, the optical shutter 22 is closed, the mirror 17 is moved to the position in the optical path of the stimulating ray beam 12a, and the erasing light source 16 is turned on. As a result, the surface of the stimulable phosphor sheet 11 is exposed to the erasing light 16a emitted by the erasing light source 16. Even though the stimulable phosphor sheet 11 is exposed to the stimulating ray beam 12a in the above manner, the electron beam energy which was stored on the stimulable phosphor sheet 11 may not be completely released from the sheet 11, instead, a part of the stored electron beam energy often remains on the sheet 11. However, when the erasing light 16a is irradiated to the stimulable phosphor sheet 11 in the above manner, the residual energy on the sheet 11 is erased and the sheet 11 becomes reusable for image recording. Noise components caused by radioactive isotopes such as Ra226 contained as impurities in the stimulable phosphor of the stimulable phosphor sheet 11 are also released upon exposure to the erasing light 16a. The erasing light source 16 may be constituted by a tungsten-filament lamp, a halogen lamp, an infrared lamp, a xenon flash lamp, a laser beam source or the like such as disclosed in, for example, U.S. Pat. No. 4,400,619. Also, the stimulating ray source 12 for image read-out may be utilized for the erasing. An image for field finding and focusing can be output to the image reproducing apparatus 26 in the same manner as mentioned above, and field finding and focusing may be carried out by viewing said image.

Figure 3:
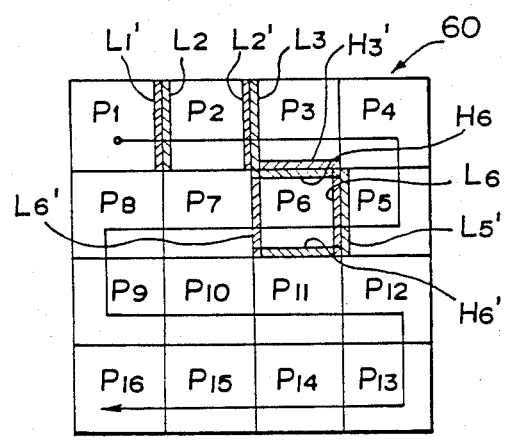
FIGS. 3 and 4 are schematic views of a composite image obtained in accordance with the present invention and the sequence of signal correction.

The output by combining a plurality of partial images of the specimen 8 will now be described. As shown in FIG. 3, the specimen 8 is divided into 16 (4×4) divisions, and a single large composite image is formed by combining electron microscope images P1, P2, ..., P16 at the respective divisions. In the course of recording the images at the respective divisions one after another on the stimulable phosphor sheet 11, field setting is carried out in accordance with a predetermined procedure, and the electron microscope images P1, P2, ..., P16 at the 16 divisions adjacent to one another are recorded one after another on the stimulable phosphor sheet 11. At this time, the aforesaid image read-out is carried out each time a single image has been recorded on the stimulable phosphor sheet 11, and the read-out image signals Sd obtained by the image read-out are stored in the memory 50. The aforesaid erasing and the recording are then repeated, and the read-out image signals Sd at all of the 16 divisions are stored in the memory 50 in correspondence with the divisions.

A signal correcting apparatus 56 for density matching is constituted by the memory 50, a density data calculating means 51, a density matching data processing means 52, a density data memory 53, a control means 54 and a memory 55. The signal correcting apparatus 56 for density matching employs a known computer system. The density data calculating means 51 first reads image signals Sd1 and image signals Sd2 respectively representing a first electron microscope image P1 and a second electron microscope image P2, such as shown in FIG. 3, from among the read-out image signals Sd stored in the memory 50, and extracts image signals at, for example, a single picture element string (boundary area) L1' of the electron microscope image P1 and image signals at a single picture element string (boundary area) L2 of the electron microscope image P2 at the boundary between the electron microscope images P1 and P2 from the image signals Sd1 and the image signals Sd2. Though the density at the picture element string L1' and the density at the picture element string L2 should be equal, they may become different from each other for the reasons mentioned above. Therefore, the density data calculating means 51 calculates a mean value A1' of the plurality of the image signals at the picture element string L1', calculates a mean value A2 of the plurality of the image signals at the picture element string L2, and calculates a correction coefficient value k2 as $$k2 = A1' - A2.$$

The value k2 is stored in the density data memory 53 as a correction value for the electron microscope image P2. The image signals Sd1 representing the first electron microscope image P1 are stored in the memory 55 via the density matching data processing means 52. On the other hand, the image signals Sd2 representing the second electron microscope image P2 are corrected uniformly by the addition of the correction coefficient k2 thereto in the density matching data processing means 52 which is controlled by the control means 54 for reading out the correction coefficient k2. The corrected image signals Sd2' obtained by the correction are stored in the memory 55 as the image signals of the second electron microscope image P2.

The density data calculating means 51 then reads the image signals Sd2 and image signals Sd3 respectively representing the second electron microscope image P2 and a third electron microscope image P3 from the memory 50. Also, in the same manner as the above, the density data calculating means 51 calculates a mean value A2' of the image signals at a boundary picture element string L2' and a mean value A3 of the image signals at a boundary picture element string L3 as shown in FIG. 3. The density data calculating means 51 also reads the value of k2 from the memory 53, and calculates a value k3 as $$k3 = (k2 + A2') - A3.$$

The value k3 is stored in the density data memory 53 as a correction value for the electron microscope image P3. The image signals Sd3 of the third electron microscope image P3 are corrected uniformly by the addition of the correction coefficient k3 thereto in the density matching data processing means 52 in the same manner as mentioned above. The corrected image signals Sd3' obtained by the correction are stored in the memory 55 as the image signals of the third electron microscope image P3. The aforesaid signal correction is carried out in accordance with the sequence as indicated by the arrow in FIG. 3 up to image signals Sd16 of the sixteenth electron microscope image P16.

When the composite image is to be output, a write control means 57 reads the image signals Sd1, Sd2', Sd3', ..., Sd16' of the electron microscope images P1, P2, P16 from the memory 55, and feeds them to a printer 58. At this time, the image signals are arranged so that the images P1 to P16 are combined in the format shown in FIG. 3, and are then fed to the printer 58. As a result, a hard copy of a composite electron microscope image 60 formed by the combination of the 16 images in the 4×4 format and representing a wide region of the specimen 8 is produced by the printer 58. As the printer 58, the apparatus shown in FIG. 2 may be utilized.

The image signals Sd' representing the composite electron microscope image 60 having been corrected in the above manner, the signal values at the boundaries or boundary areas L1' and L2 between the two adjacent images are therefore equal to each other. This also applies to the signal values at the boundaries L2' and L3, and so on. Therefore, in the composite electron microscope image 60, no difference in density is given rise to at the boundaries among the respective partial images.

In the aforesaid embodiment, at the time the signal correction is carried out for the electron microscope images P6 onward, the two images adjacent to said electron microscope image have already been subjected to the signal correction. Specifically, at the time the signal correction is carried out for the electron microscope image P6, for example, the upper adjacent electron microscope image P3 and the right adjacent electron microscope image P5 have already been signal-corrected. Though the same results should naturally be obtained between the case where the aforesaid correction of the image signals is carried out based on one of the two adjacent images already subjected to the correction and the case where the correction is carried out based on the other of said two adjacent images, different results may be obtained because of correction error or the like. Therefore, for the electron microscope images P6 onwards, the aforesaid correction may be carried out based on both the two adjacent images already subjected to the correction. For example, as for the electron microscope image P6, a correction value k6 may be calculated based on corrected image signals Sd5' of the electron microscope image P5 in the same manner as mentioned above, a correction value k6' may be calculated based on the image signals of the electron microscope image P3 after correction and the image signals of the electron microscope image P6 at the boundary therebetween in the same manner as mentioned above, and a mean value of the correction values k6 and k6' may be uniformly added to the image signals Sd6.

Figure 5:
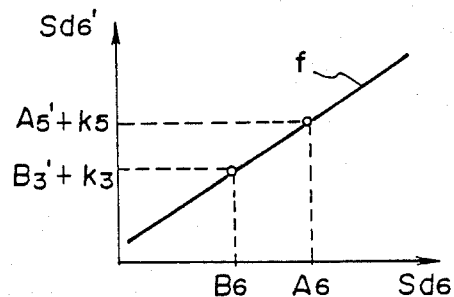
FIG. 5 is a graph illustrating signal conversion in the method of the present invention.

Alternatively, the image signals Sd6 may be corrected so that the mean density at an upper boundary H6 of the electron microscope image P6 and the mean density at a right boundary L6 as shown in FIG. 3 respectively become equal to the mean density at a boundary H3' of the upper adjacent electron microscope image P3 and the mean density at a boundary L5' of the right adjacent electron microscope image P5. Specifically, as shown in FIG. 5, in the case where the mean value of the image signals at the upper boundary H6 and that at the right boundary L6 are respectively B6 and A6, and the mean value of the image signals at the boundary H3' and that at the boundary L5' are respectively B3' and A5', the original image signals Sd6 may be converted by use of the characteristics indicated by a straight line f so that the signal value B6 is converted to (B3'+k3) and the signal value A6 is converted to (A5'+k5). If the image signals after conversion are designated by Sd6', the formula of the straight line f is expressed as $$Sd6' = \frac{B3' + k3 - A5' - k5}{B6 - A6}(Sd6 - B6) + (B3' + k3).$$

Accordingly, all of the original image signals Sd6 that represent the electron microscope image P6 may be linearly converted in accordance with the above formula to Sd6'. Also, the same operations may be carried out for the seventh electron microscope image P7 and subsequent electron microscope images. At the time image signals Sd7 representing the seventh electron microscope image P7 are to be converted in the above manner, the mean signal value (A6'+k6) at a boundary L6' is calculated based on the image signals Sd6' after conversion. Also, at the time image signals Sd11 representing the eleventh electron microscope image P11 are to be converted in the above manner, the mean signal value (B6'+k6) at a boundary H6' is calculated based on the image signals Sd6' after conversion. Thereafter, the same operations may be carried out.

Figure 4:
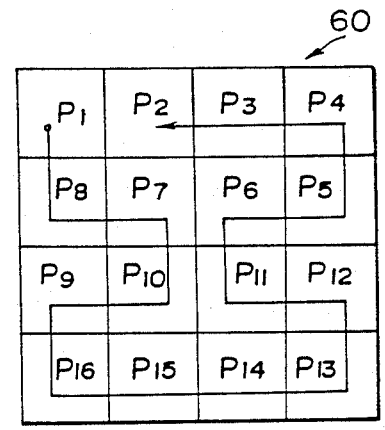

The sequence of correction of the image signals of the respective partial images is not limited to that in the aforesaid embodiment, and may be adjusted to the sequence indicated by the arrow in FIG. 4.

Also, although in the aforesaid embodiment the correction is carried out for all of the electron microscope images P2 onward, the signal correcting apparatus 56 may be constituted so that the correction is carried out only for a desired region.

We claim:

1. An apparatus for outputting an electron microscope image, which comprises:
   (i) two-dimensional sensor for storing an electron beam image of a specimen formed by distribution of electron beam energy, said two-dimensional sensor being in the same vacuum system as an image formation plane of said electron microscope,
   (ii) a stimulation means for exposing said two-dimensional sensor to light or heat,
   (iii) a detection means for photoelectrically detecting light emitted by said two-dimensional upon exposure to light or heating, thereby to obtain image signals, and
   (iv) a signal correction means for correcting the image signals detected at a plurality of divisions into which said specimen has been divided and storage of the electron beam image carried out for each of said divisions, so that signal values of the boundary areas of adjacent divisions become approximately equal to each other, wherein said signal correction means comprises:

a first memory means for storing image signals of said plurality of divisions;

density data calculating means for calculating mean values for picture element strings at the boundaries between adjacent divisions of said plurality of divisions read from said first memory means and calculating correction coefficient values from said mean values;

density data memory means for storing said correction coefficient values;

density matching data processing means receiving said correction coefficient values for uniformly correcting said image signals of said plurality of divisions;

control means for selectively supplying said correction coefficient values to said density matching data processing means when one of said image signals of one of said plurality of divisions is to be uniformly corrected; and second memory means for storing the output of said density matching data processing means.

2. A method of outputting an electron microscope image by exposing a two-dimensional sensor for electron beam energy storage to an electron beam passing through a specimen in a vacuum to have the electron beam energy stored on the two-dimensional sensor, then exposing the two-dimensional sensor to light or heat to release the stored energy as light emission, photoelectrically detecting the emitted light to obtain image signals, and outputting an electron beam image of the specimen on the basis of the image signals, wherein the improvement comprises the steps of:

(i) dividing said specimen into a plurality of divisions and carrying out said storage of the electron beam energy for each of said divisions, (ii) combining said image signals obtained at said divisions so that composite image signals represent an overall specimen image formed by a group of said divisions, and (iii) correcting said image signals so that signal values of the boundary areas of adjacent divisions become approximately equal to each other, wherein a stimulable phosphor sheet is used as said two-dimensional sensor, said stimulable phosphor sheet is exposed to said electron beam passing through said specimen in said vacuum to have the electron beam energy stored on said stimulable phosphor sheet, said stimulable phosphor sheet is then scanned with stimulating rays and is caused thereby to emit light, and the emitted light is detected photoelectrically, wherein said image signal correcting step comprises the following steps:

storing image signals of said plurality of divisions;

calculating mean values for picture element strings at the boundaries between adjacent divisions of said plurality of divisions;

calculating correction coefficient values from said mean values;

storing said correction coefficient values;

supplying said correction coefficient values to said density matching data processing means when one of said image signals of one of said plurality of divisions is to be uniformly corrected;

uniformly correcting said image signals of said plurality of divisions based on said correction coefficient values; and storing said corrected signals and the uncorrected signals.

* * * * *